(12) United States Patent
Taylor

(10) Patent No.: US 6,437,961 B1
(45) Date of Patent: Aug. 20, 2002

(54) ELECTROSTATIC DISCHARGE CIRCUIT HAVING POWER-UP AND POWER-DOWN PROTECTION

(75) Inventor: Clive Roland Taylor, Hertfordshire (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/822,729

(22) Filed: Mar. 30, 2001

(51) Int. Cl.⁷ .............................................. H02H 3/22
(52) U.S. Cl. ...................... 361/111; 361/56; 327/310; 327/428
(58) Field of Search ................... 361/111, 56; 257/139, 257/174, 356, 546; 327/310, 428

(56) References Cited

U.S. PATENT DOCUMENTS

| | | | | |
|---|---|---|---|---|
| 5,326,994 A | * | 7/1994 | Giebel et al. ................ | 257/174 |
| 5,742,084 A | | 4/1998 | Yu ............................... | 257/356 |
| 5,781,388 A | | 7/1998 | Quigley ........................ | 361/56 |
| 5,907,464 A | * | 5/1999 | Maloney et al. ............. | 361/111 |
| 6,016,002 A | * | 1/2000 | Chen et al. .................. | 257/546 |
| 6,046,894 A | * | 4/2000 | Ida ............................... | 361/56 |
| 6,072,682 A | * | 6/2000 | Ravanelli et al. ........... | 361/111 |

\* cited by examiner

Primary Examiner—David Nelms
Assistant Examiner—Tu-Tu Ho
(74) Attorney, Agent, or Firm—Peter Zawilski

(57) ABSTRACT

The reliability and operability of semiconductor devices is improved using a circuit arrangement that protects the device against malfunction and harm during operation. According to an example embodiment of the present invention, a semiconductor device includes a protection circuit that is adapted to discharge excess current and/or voltage in response to the voltage level at an input pad and to the operating condition of the device. The circuit protection circuit is configured to a first configuration during a power-up mode and to a second configuration during a power-down mode. When the voltage at the input pad reaches a selected threshold, the input voltage is discharged.

22 Claims, 4 Drawing Sheets

ELECTROSTATIC DISCHARGE CIRCUIT HAVING POWER-UP AND POWER-DOWN PROTECTION

FIELD OF THE INVENTION

The present device relates generally to semiconductor devices and, more particularly, to semiconductor devices and their manufacture involving the protection of circuitry in the device.

BACKGROUND OF THE INVENTION

In recent years, the semiconductor industry has realized tremendous advances in technology which have permitted dramatic increases in circuit density and complexity, and equally dramatic decreases in power consumption and package sizes. Present semiconductor technology now permits single-chip microprocessors with many millions of transistors, operating at speeds of hundreds of MIPS (millions of instructions per second) to be packaged in relatively small, air-cooled semiconductor device packages. A requirement of such high-density and high functionality in semiconductor devices has been the demand for increased density of individual circuitry within the chip. The increased density permits shorter electrical connections between the devices than possible in chips manufactured with circuitry in a less-dense arrangement.

A by-product of increased circuit density and decreased chip size is an increase in operating conditions that can adversely affect the performance of the device and damage circuitry therein. One such operating condition involves electrostatic discharge (ESD). ESD is a condition that can occur in conjunction with various device operations, and can potentially cause harm to circuitry. For instance, operational conditions that are outside of normal conditions, such as excess static charge in the device, can cause ESD during power-up and power-down on standard digital CMOS processes. Voltages and/or currents resulting from the excess static charge present during these and other processes can reach levels that are much higher than normal operating levels for circuitry in a semiconductor device. When the static charge is applied to device circuitry, the circuit operation can be affected. In addition, when voltage and/or current resulting from the ESD is high enough, the circuitry can be damaged.

Another operating condition that can cause problems with semiconductor devices is known as "latch-up." Latch-up is an undesirable and sometimes self-destructive phenomenon that occurs when an inadvertent low-resistance path is created between power supply nodes (often referred to as $V_{DD}$ and $V_{SS}$) in a semiconductor device. An inadvertent low-resistance path can pass current at levels that exceed the tolerance of the circuitry carrying the path. Consequently, such large currents can generate high levels of heat, ultimately resulting in cessation of circuit functions and even permanent destruction of the circuit.

Latch-up typically occurs as a result of the proximate locations of circuits, circuit components and portions of circuit components, which tend to be spaced in close proximity due to the high-density requirements of semiconductor devices. For example, in the design of complimentary metal-oxide semiconductor (CMOS) devices, there are complementary parasitic bipolar transistor structures that are in close proximity to one another. The close proximity allows the complimentary parasitic bipolar structures to interact electrically to form device structures that behave like pnpn diodes. Normally, such diodes are reverse-biased. However, in the presence of certain operating conditions, such as transient displacement currents, terminal over-voltage stress, ionizing radiation, or impact ionization by hot electrons, a normally reverse-biased diode becomes a forward-biased diode. Once the device becomes forward biased, current flows freely between the nodes of the device. As long as sufficient power is supplied, the device remains in the "ON" state and exhibits latch-up. For additional details concerning the mathematics of, and efforts to overcome, the latch-up problem, reference may be made to various references such as R. R. Troutman, Latchup in CMOS Technology—The Problem and its Cure, Kluwer Academic Publishers, Boston, Mass., 1986, and S. Wolf, Silicon Processing for the VLSI Era- Volume 11, Lattice Press, Sunset Beach, Calif. 1990, each of which is incorporated herein by reference.

Problems associated with ESD and latch-up continue to inhibit the performance and reliability of semiconductor devices, and problems associated with ESD in standard digital CMOS processes has been particularly difficult to address. In addition, while attempts to overcome latch-up problems have been successful to various levels of degree, as addressed in the above-cited references, latch-up continues to be a problem in semiconductor devices.

SUMMARY OF THE INVENTION

The present invention makes possible the protection against electro-static charge, latch-up and other operational conditions that can potentially inhibit performance of and/or cause harm to semiconductor devices, and addresses problems stated in the Background hereinabove. The present invention is exemplified in a number of implementations and applications, some of which are summarized below.

According to an example embodiment of the present invention a semiconductor device comprises an input pad and a protection circuit. The protection circuit includes a first circuit coupled to the input pad and is adapted to effect voltage discharge in response to voltage at the pad reaching a threshold. The first circuit is configured in a first configuration for a power-up mode and in a second configuration in a power-down mode, each configuration exhibiting a different voltage discharge threshold selection. The device exhibits resistance to a tendency to latch-up, and is applicable to semiconductor devices including those exhibiting standard digital CMOS processes.

In another example embodiment of the present invention, a semiconductor device includes the protection circuit described hereinabove, coupled to a second circuit adapted to discharge voltage when voltage at the input pad is above a junction breakdown voltage for an input buffer to which the circuit is applicable.

The above summary is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
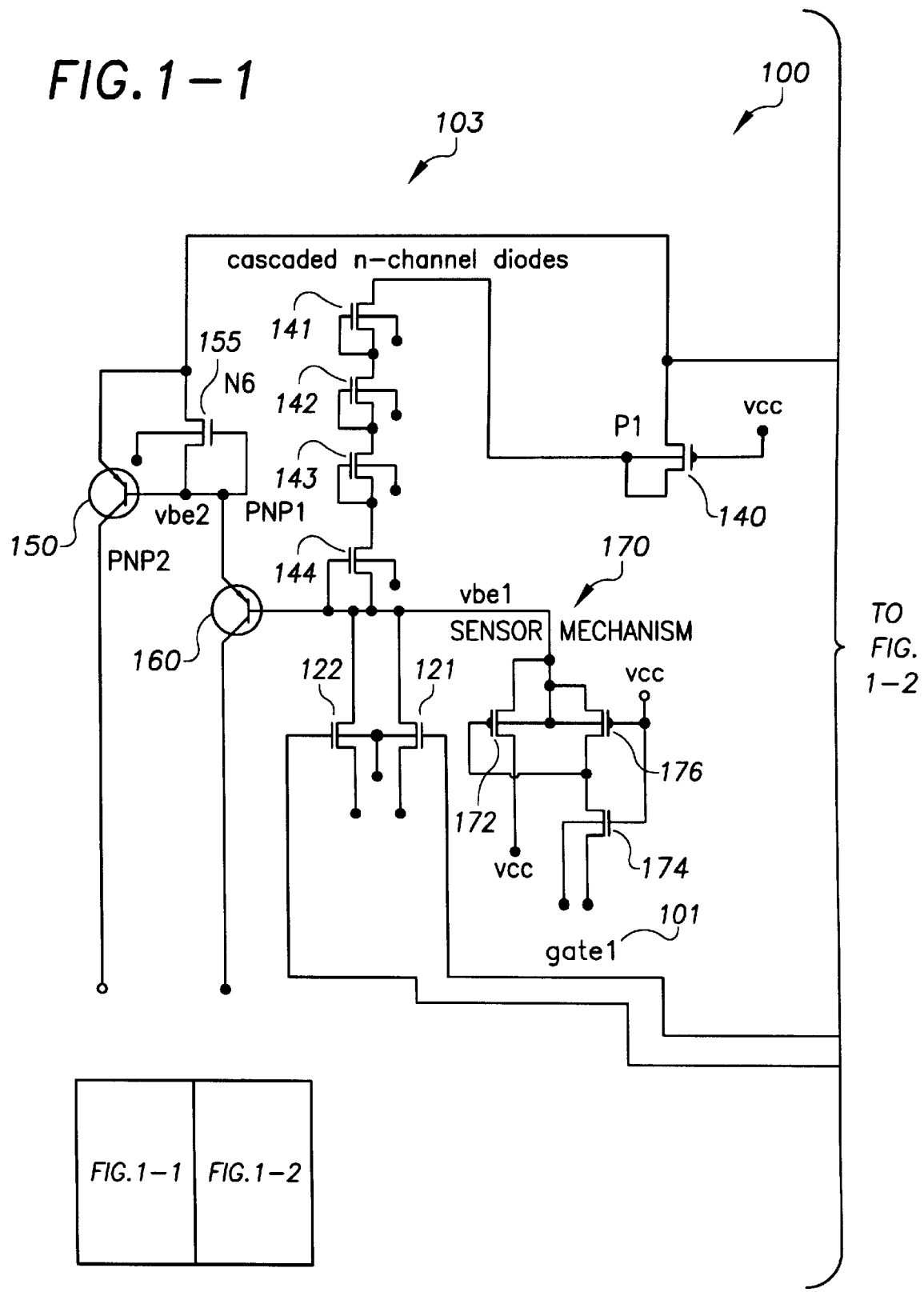
FIG. 1 is a block circuit diagram, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for use in connection with devices exhibiting operational traits that can cause circuit malfunctions. While the present invention is not limited to such devices, an appreciation of various aspects of the invention is best gained through a discussion of various examples using this application.

According to an example embodiment of the present invention, a semiconductor device having an input pad is adapted to effect current and/or voltage discharge in an integrated circuit in response to a current or voltage supply at the pad that exceeds a safe level. A discharge circuit is coupled to the pad to effect voltage discharge from the pad to a node, such as a $V_{SS}$ or $V_{DD}$ node, in response to the pad reaching the safe level, or threshold. The discharge circuit is adapted to be programmed to a first configuration in a power-up mode and to a second configuration in a power-down mode. The ability of the device to operate under selected conditions in response to power up and power down modes (e.g., during power cycles) makes possible tailored circuit protection for limiting the amount of current and/or voltage supplied to an integrated circuit via the input pad in operating modes including power-up and power-down. In one implementation, the device is adapted to undergo a power cycle while an input signal is toggled on the input pad. This circuit protection enhances the ability to effect ESD in integrated circuit devices, and is applicable to semiconductor dies having a standard digital process. In addition, the device is adapted to exhibit immunity to latch-up conditions that can affect the operation of the circuitry.

Various implementations of the device are realized for selected applications. For example, the device can be implemented in conjunction with a standard ESD circuit, such as that described in U.S. Pat. Nos. 5,781,388 and 5,742,084. In addition, the device can be implemented having standard DC over-voltage behavior, wherein DC voltages applied to the pad that exceed a selected threshold are discharged. The voltage threshold at which the circuit discharges can also be predetermined to meet needs of the selected application to which the device is applied, and can be used to limit static current applied to the application, for example, to less than about 100 nA. Each of the applications discussed herein is applicable to a variety of integrated circuits, including semiconductor dies and other circuitry.

In another example embodiment of the present invention, the device includes a trigger circuit adapted to send a trigger signal to effect the current and/or voltage discharge. The trigger circuit is programmed to send the trigger signal when a pre-programmed response level is detected. In addition, a latch can be implemented via the trigger circuit, wherein the discharge circuit is latched into a discharge mode in response to the input voltage at the pad reaching a selected threshold. The latch is held at least until the input voltage drops below the threshold. In a more particular implementation, a timer is implemented to hold the latch until the voltage drops below the threshold and remains below the threshold for a selected period of time.

In a more particular example embodiment of the present invention, the device further includes a second circuit coupled to the input pad. The second circuit causes current discharge in response to voltage at the pad reaching a junction breakdown voltage for the device. The current discharge is effected using a commonly available device, such as a standard silicon controlled rectifier (SCR) device. For example, in one implementation, the second circuit is adapted to effect current discharge in response to the pad reaching a junction breakdown voltage of about 12V, leaving any charge less than 12V to the first discharge circuit described hereinabove.

In another implementation, the second circuit is adapted to discharge current until the pad voltage drops below the junction breakdown voltage. This is accomplished, for example, using a latch that closes when the voltage exceeds the junction breakdown, and opens when the voltage drops below the breakdown. In a more particular implementation, a delay circuit is coupled to the latch and is adapted to cause the latch to remain closed for a selected amount of time after the voltage drops below the breakdown. The amount of time that the latch is held is selected for the particular application to which the circuit is applied, and typically is selected to be long enough to sufficiently discharge current such that the device is protected from excess charge.

The present invention can be implemented using a variety of circuit structures. FIG. 1 shows one such circuit structure 100, according to an example embodiment of the present invention. The circuit includes an input pad 106 adapted to receive an input from one or more circuit elements. For a pad voltage above a first junction breakdown (e.g., BVDSS1 about equal to 12 volts), a primary ESD structure 110 is coupled to the input pad 106 and is adapted to discharge a majority of any accumulated charge at the pad 106. In one particular implementation, the BVDSS1 structure 110 exhibits a first order diffusion to diffusion breakdown structure in substrate in which the circuit is formed. In another particular implementation, the BVDSS1 structure is modified for lower breakdown voltages.

A second ESD circuit including BVDSS2 structure 105 is also coupled to the input pad and includes a trigger voltage that enables a secondary ESD circuit 103 to latch and discharge the input until a threshold is reached, using trigger circuit 120. The BVDSS2 structure can be implemented in a variety of manners, depending upon the selected application. For example, the first circuit may include one or more of a p-channel field oxide device, a n+/p+ unsilicided reverse biased poly diode, and a thick oxide cascaded device. The trigger is adapted to achieve a discharge voltage in response to the voltage at the pad being between about 4V and 8V (e.g., about 7 volts).

When a selected trigger voltage is present at the pad 106, transistor 122 is turned on and, after capacitor 131 has been charged up by device 127, transistor 121 is turned on. When BVDSS2 105 ceases to conduct, transistor 122 is switched off and transistor 121 turns off after a delayed turnoff time determined by an RC time constant, defined as being C1× (RP3+RP4), wherein C1 is the capacitance of capacitor 131 and RP3 and RP4 are the resistance of resistors 126 and 129, respectively. Resistors 109 and 126 make up a resistor divider circuit that turns on device 121 indirectly via gate 1 (node 101) and turns on device 122 directly via gate 2 (node 102). Diode circuits 123 and 124 are adapted to limit the voltage at gate 2 to the value of the cumulative threshold voltages of the diode circuits 123 and 124. Resistor 107 is coupled between the input pad 106 and the secondary discharge circuit 103 and is adapted to limit the current flow to the circuit 103. The resistivity of resistor 107 is selected for each application, and in one implementation is maximized relative to expected frequency of a signal applied to the input pad 106 and satisfies standard ESD model requirements.

In a power on state, devices 125 (N5) and 128 (N4) clamp gate 1 and gate 2 to ground, and sensor circuit 170 switches Vbe1 to a $V_{CC}$ power supply, via the diode circuit 172. The sensor circuit includes the p-channel diode circuit 172 and an inverter circuit having transistors 174 and 176. In the power-on state, the p-channel diode circuit 172 becomes forward biased, which causes the p-channel diode circuit to conduct when the voltage at the pad is greater than the result provided by $V_{CC}+2\times Vbe$. Effectively, Vbe1 sets the reference voltage for the pad voltage, and causes a discharge via a path to substrate ($V_{SS}$) through cascaded bipolar transistors 150 and 160 when the pad voltage goes high (e.g., goes static due to excess static charge).

In the power-down state, device 172 is fully switched off by the inverter circuit. Transistors 121 and 122 are turned on when the pad voltage goes high (e.g., via the triggers) and clamp Vbe1 to $V_{SS}$. When a signal is present on the input pad 106 under these conditions with a maximum voltage $V_{CC}$, cascaded diode circuits 141, 142, 143 and 144 are enabled via Pmos diode circuit 140, which holds Vbe1 between $V_{CC}$ and $4 \times VTN+VTP$, wherein VTN is the voltage threshold of circuits 141–144 and VTP is the voltage threshold of circuit 140. Transistor 155 maintains Vbe2 below Vbe+VTN.

Figures 1, 2:
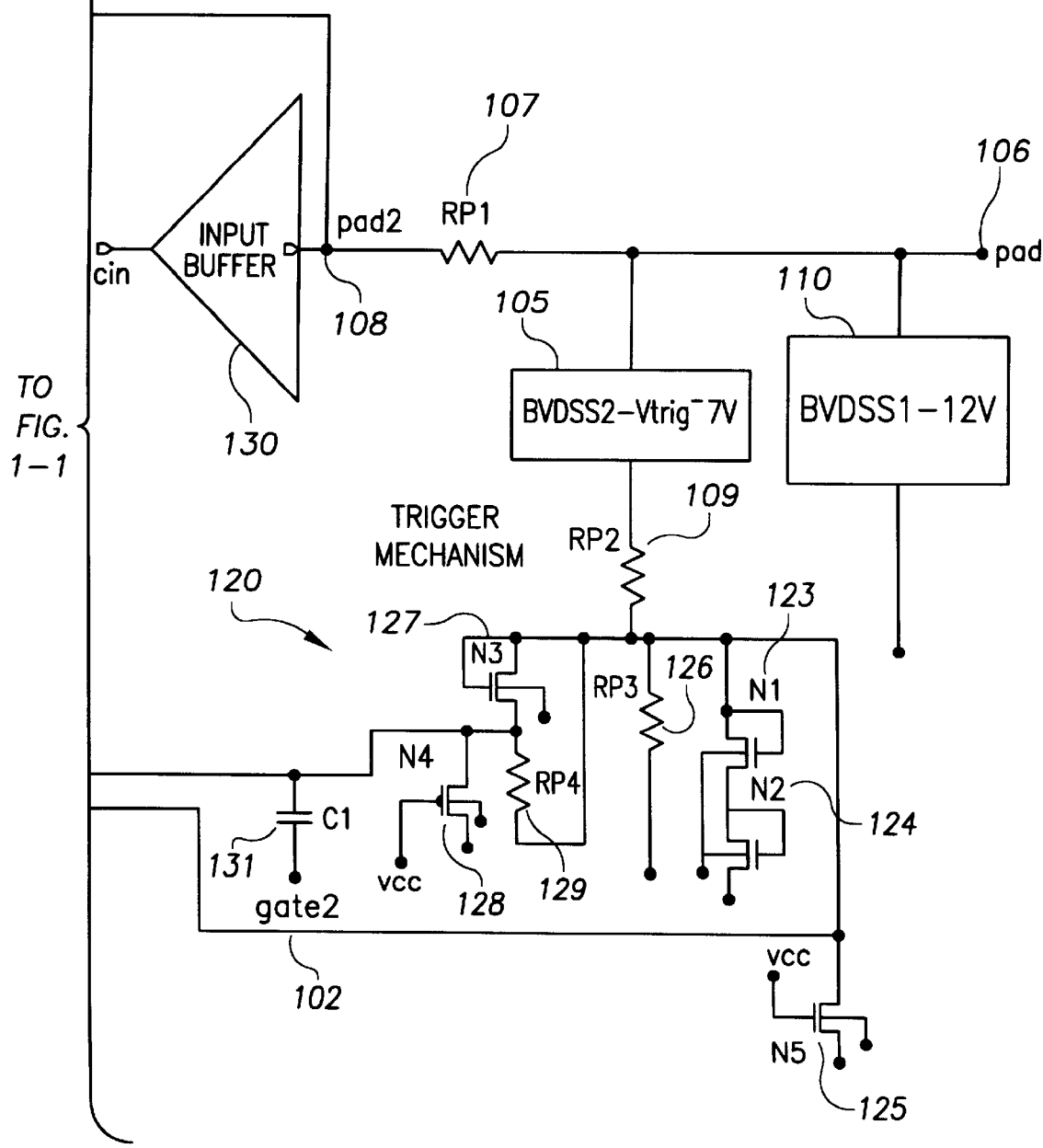
FIG. 2 is a flow diagram for inhibiting ESD, according to another example embodiment of the present invention.
Figure 2:
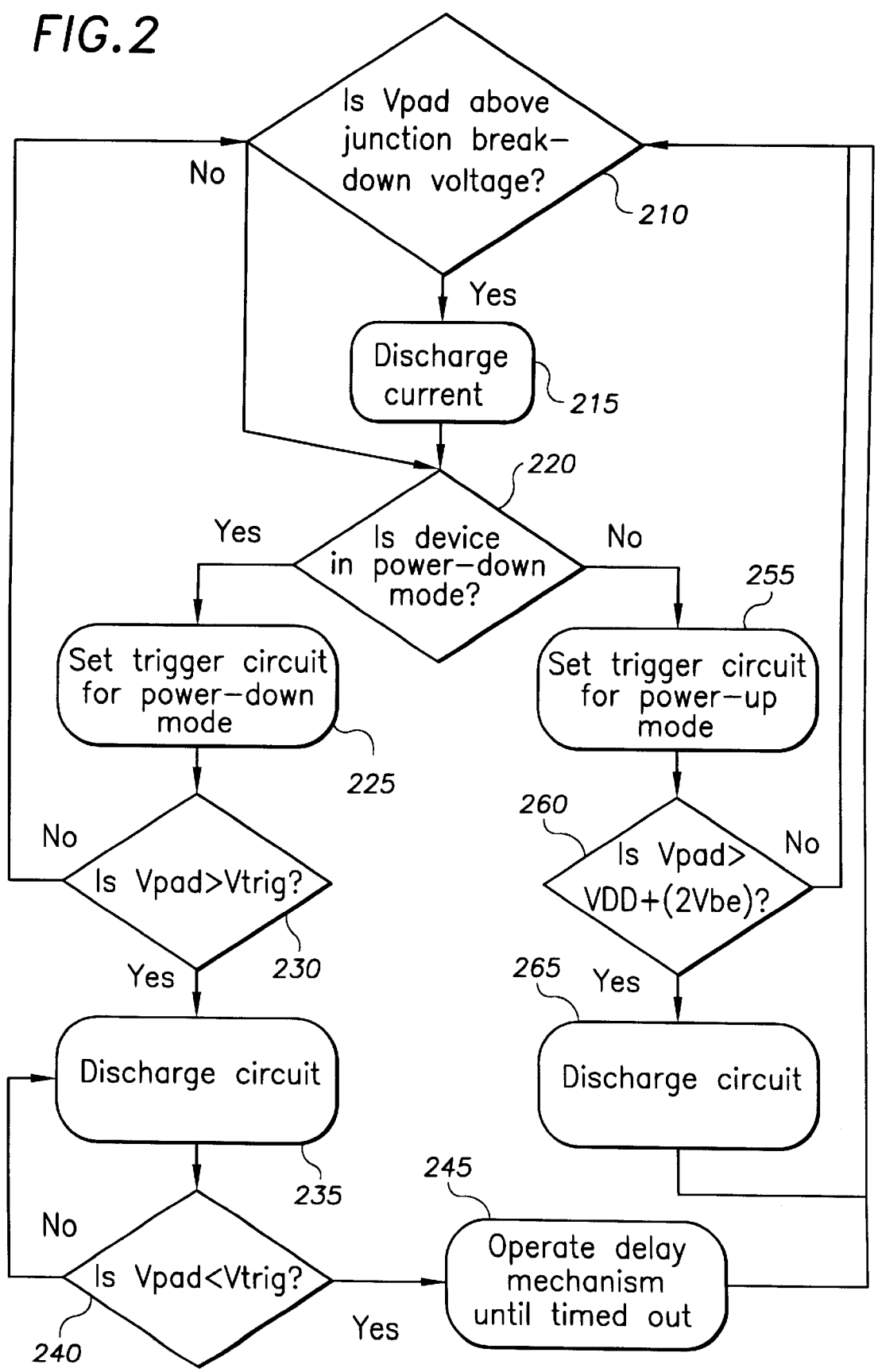

FIG. 2 is a flow diagram showing the operation of a continuous electrical discharge circuit, such as one of the circuits described hereinabove, according to an example embodiment of the present invention. At block 210, voltage at an input pad (Vpad) of a semiconductor device is detected, and if it is above a breakdown voltage, current is discharged at block 215. After the current is discharged, or if Vpad is not above a break-down voltage at block 210, the mode of the device is detected at block 220. The discharge circuit is set for either a power-down mode or a power-up mode, depending upon the mode detected at block 220.

When the device is in a power-down mode, the discharge circuit is set for the power-down mode at block 225 and Vpad is compared to a trigger voltage (Vtrig) at block 230. Vtrig is selected based upon the application in which the device is used, and in one implementation is set at about 7V. If Vpad is less than Vtrig, there is no excess charge present and the process cycles back to block 210. If Vpad is greater than Vtrig, a second stage circuit is triggered on at block 235, and the charge at Vpad is discharged to ground. At block 240, Vpad is again compared to Vtrig. If Vpad is not less than Vtrig, the second stage circuit remains triggered on at block 235. If Vpad is less than Vtrig, a delay mechanism is operated until timed out at block 245. Once the delay mechanism has timed out, the second stage circuit is triggered off and the process resumes at block 210.

When the device is in a power-up mode, the discharge circuit is set for the power-up mode at block 255 and Vpad is compared to a value of VDD+2Vbe at block 260, wherein VDD is the operating voltage of the power supply to the device, and Vbe is the base-emitter diode drop of the device. If Vpad is greater than VDD+2Vbe, the trigger mechanism is disabled and the circuit is discharged at block 265. If Vpad is not greater than VDD+2Vbe at block 260, or after the circuit is discharged at block 265, the process resumes at block 210. This effectively operates the device as a zener diode voltage clamp that grounds for voltages above the VDD+2Vbe value.

Figure 3:
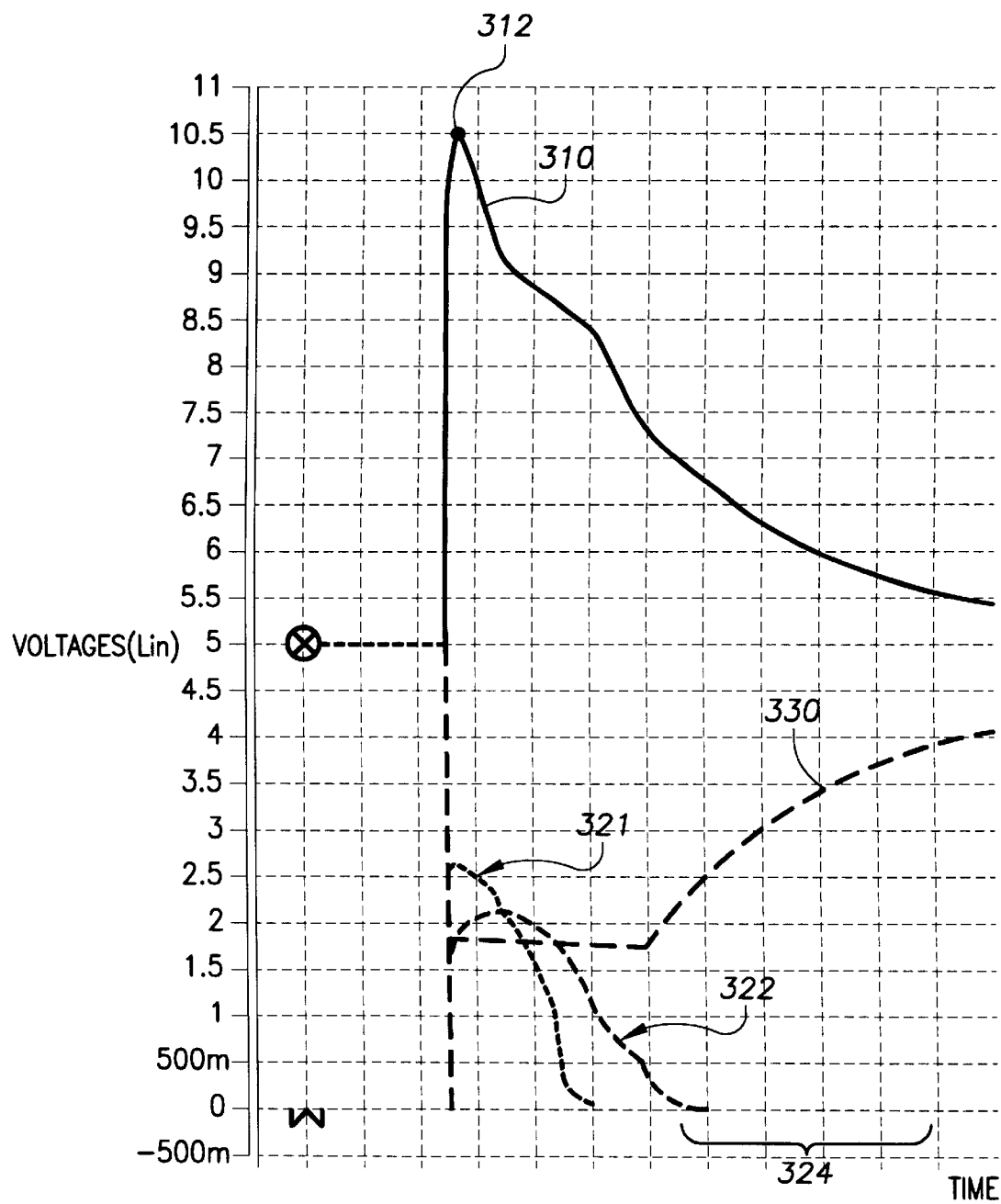
FIG. 3 is a graph showing selected aspects of the operation of circuitry, according to another example embodiment of the present invention.

The resulting discharge behavior of the circuit in which the device is used depends on the particular circuit and upon the selections for operating parameters including trigger voltages. FIG. 3 shows behavior for one such circuit undergoing a power-down condition, according to another example embodiment of the present invention. Voltage is plotted on the vertical scale, and time is plotted over the horizontal scale. FIG. 3 shows an input voltage curve 310, corresponding voltage curves 321 and 322 for first and second gates and, curve 330 for voltage at the pad sites. The gate and pad curves are, for example, representative of voltages applicable to gates 121 and 122 and to pads 106 and 108 in FIG. 1.

As the voltage spike 312 is encountered, the input voltage exceeds a selected threshold, here shown as 7V, and the supply is discharged until the voltage falls below the threshold. Gate voltage curves 321 and 322 rise slightly and then fall from the onset of the spike. The supply is discharged until it falls 7V, where the voltage drop at the gates stabilizes, as shown in curve portion 324. Once below 7V, the voltage at the pad sites shown in curve 330 rises to meet the supply voltage curve 310. In this instance, the spike is shorted while it remains over 7V, and protects the circuitry in the device.

While the present invention has been described with reference to several particular example embodiments, those skilled in the art will recognize that many changes may be made thereto without departing from the spirit and scope of the present invention, which is set forth in the following claims.

What is claimed is:

1. A semiconductor device comprising:
    an input pad;
    a first circuit coupled to the pad and adapted to effect voltage discharge in response to voltage at the pad reaching a threshold, the first circuit being adapted to be configured to a first configuration for a power-up mode and to a second configuration in a power-down mode; and
    a delay circuit coupled to the first circuit and adapted to maintain the voltage discharge at the first circuit for a selected period of time.

2. The device of claim 1, wherein the input pad and first circuit are part of an electrical circuit path that includes a standard ESD path.

3. The device of claim 1, wherein the device is adapted to discharge a static voltage that exceeds a pre-determined voltage threshold.

4. The device of claim 1, wherein the input pad is adapted to undergo a power cycle while an input signal is toggled on the input pad.

5. The device of claim 1, wherein the device is adapted to limit static input current to less than about 100 nA.

6. The device of claim 1, wherein the device is adapted to exhibit DC over-voltage behavior.

7. The device of claim 1, further comprising a second circuit coupled to the input pad and adapted to effect current discharge in response to voltage at the pad reaching a junction breakdown voltage for the device.

8. The device of claim 7, wherein the second circuit is adapted to effect current discharge in response to the pad reaching a junction breakdown voltage of about 12V.

9. The device of claim 7, wherein the second circuit is adapted to discharge current until the pad voltage drops below the junction breakdown voltage.

10. The device of claim 1, further comprising a trigger mechanism coupled to the first circuit and adapted to trigger the first circuit to effect the voltage discharge.

11. The device of claim 10, wherein the first circuit is adapted to latch in a voltage discharge mode during a power-down mode in response to the pad voltage rising above a selected trigger voltage.

12. A semiconductor device comprising:

an input pad;

a first circuit coupled to the pad and adapted to effect voltage discharge in response to voltage at the pad reaching a threshold, the first circuit being adapted to be configured to a first configuration for a power-up mode and to a second configuration in a power-down mode, wherein the first circuit is adapted to latch in a voltage discharge mode during a power-down mode in response to the pad voltage rising above a selected trigger voltage;

a trigger mechanism coupled to the first circuit and adapted to trigger the first circuit to effect the voltage discharge; and a delay circuit coupled to the first circuit and adapted to maintain the first circuit in the voltage discharge mode for a selected time period after the pad voltage drops below the trigger voltage.

13. The device of claim 10, wherein the first circuit is triggered at a selected trigger voltage of about 7 volts.

14. The device of claim 10, further comprising a resistor coupled between the trigger circuit and the first circuit.

15. The device of claim 14, wherein the resistor is adapted to limit current flow and act as a voltage divider.

16. The device of claim 1, wherein the first circuit is adapted to operate as a zener diode voltage clamp to ground for voltages above a supply voltage in response to the device being in a power-up mode.

17. The device of claim 1, wherein the device is further adapted to operate in a semiconductor die having a standard digital process.

18. The device of claim 1, further comprising a SCR device.

19. The device of claim 1, further comprising at least two cascaded bipolar devices having ESD protection, the bipolar devices being coupled to the first circuit and adapted to discharge voltage in response to the first circuit.

20. The device of claim 1, wherein the first circuit includes at least one of: a p-channel field oxide device, a n+/p+ unsilicided reverse biased poly diode, and a thick oxide cascaded device adapted to achieve a discharge voltage in response to the voltage at the pad being between about 4V and 8V.

21. The device of claim 1, further including a comparison circuit adapted to compare the voltage at the pad to a threshold voltage level.

22. The device of claim 21, wherein the selected period of time is a function of the comparison circuit.

* * * * *